United States Patent
Yoshiyama

[11] Patent Number: 5,966,630
[45] Date of Patent: Oct. 12, 1999

[54] WIRE BONDING METHOD

[75] Inventor: Takayuki Yoshiyama, Tosu, Japan

[73] Assignee: Matsushita Electric Industrial Co., Ltd., Osaka, Japan

[21] Appl. No.: 09/065,694

[22] Filed: Apr. 24, 1998

[30] Foreign Application Priority Data

Apr. 25, 1997 [JP] Japan .................................. 9-108785

[51] Int. Cl.$^6$ .................................................. H01L 21/44
[52] U.S. Cl. ........................... 438/612; 438/106; 438/108; 438/118
[58] Field of Search .................... 438/612, 106, 438/108, 118

[56] References Cited

U.S. PATENT DOCUMENTS 5,302,550  4/1994  Hirota et al. ............................. 438/106
5,349,234  9/1994  DesJardin et al. ....................... 438/118
5,668,058  9/1997  Tanioka et al. .......................... 438/108

*Primary Examiner*—Kevin M. Picardat
*Assistant Examiner*—Deven Collins
*Attorney, Agent, or Firm*—Stevens, Davis, Miller & Mosher, L.L.P.

[57] ABSTRACT

A wire bonding method in which an electric spark is generated between a lower end of a wire inserted through a capillary tool and a torch so as to form a small diameter ball, and then the electric spark is again generated so as to increase the diameter of the ball to form a large ball. The large ball is pressed against a pad on a chip with a lower surface of the capillary tool, so that the large ball is bonded to the pad. Since the large ball is soft, it can be sufficiently crushed by the lower surface of the capillary tool and be tightly bonded to the pad. Accordingly, the method accomplishes excellent wire bonding immediately after a bonding operation is restarted even after a long waiting time between bonding operations.

2 Claims, 2 Drawing Sheets

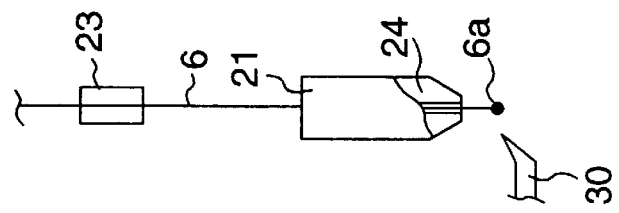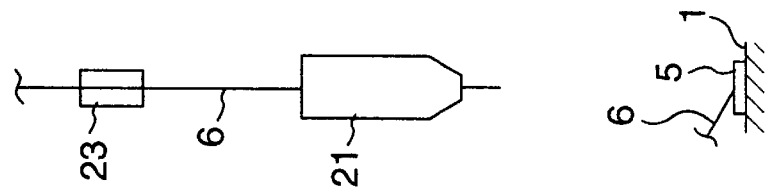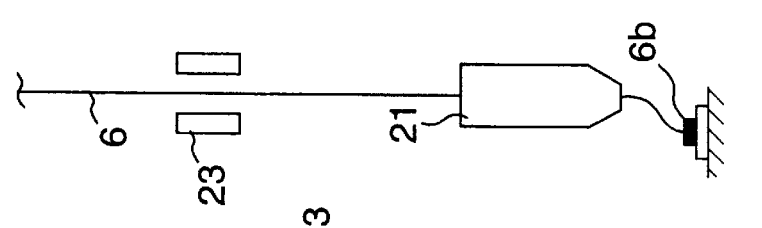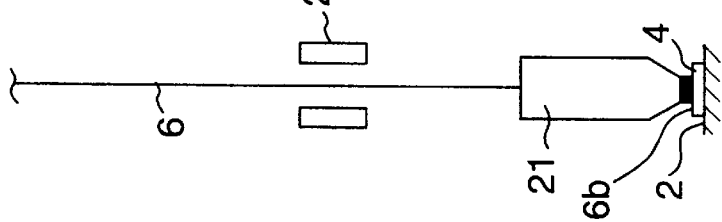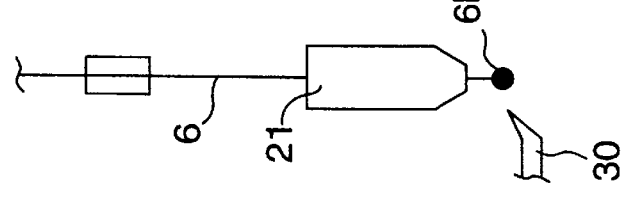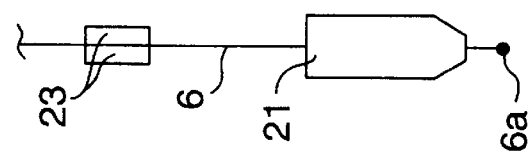

WIRE BONDING METHOD

BACKGROUND OF THE INVENTION

1. Field of the Invention

The present invention relates to a wire bonding method for connecting a pad on a chip and an electrode on a substrate through a wire.

2. Description of the Related Art

A wire bonding process for electrically connecting a pad on a chip and an electrode on a substrate such as a printed board and a lead frame through a wire is accomplished in the following manner. First, an electric spark is generated between a lower end of the wire inserted through a capillary tool and a torch so as to form a ball on the lower end of the wire. Then, the capillary tool is lowered so as to press this ball against the pad on the chip, whereby the ball is bonded to the pad. Next, the capillary tool is moved onto the electrode on the substrate so as to press the wire against the electrode, whereby the wire is bonded to the electrode. Subsequently, the capillary tool is lifted and the wire is cut off on a bonding point to the electrode so as to again generate the electric spark between the lower end of the cut wire and the torch, whereby the ball is formed so as to proceed to the subsequent wire bonding operation.

However, due to a removal/attachment of the substrate to be wire-bonded from/to a wire bonding stage or the like, the wire bonding operation is sometimes temporarily stopped. In such a case, the capillary tool is waiting over the stage for a while, and thus the ball formed on the lower end of the wire is hardened during this wait. Then, after the removal/attachment of the substrate or the like is completed, when the wire bonding operation is restarted so as to press this ball against the pad on the chip for the bonding, a problem is caused. That is, since this ball is hardened during the wait, even if the ball is pressed against the pad by a lower surface of the capillary tool, the ball is not sufficiently crushed and thus is prone to a faulty bonding. It is desirable that the ball is crushed by the lower surface of the capillary tool and bonded to the pad on the chip over a wide area.

There is another problem in which, since the ball is brought into contact with air during the above-described wait whereby its surface is oxidized and an oxidized film is thus formed, a material of the ball is deteriorated.

It is therefore an object of the present invention to provide a wire bonding method for solving the above conventional problems and capable of excellently accomplishing a wire bonding immediately after an operation is restarted even after a long waiting time.

SUMMARY OF THE INVENTION

According to the first aspect of the present invention, there is provided a wire bonding method comprising the steps of: generating an electric spark between a lower end of a wire inserted through a capillary tool and a torch so as to form a small ball on the lower end of the wire; generating the electric spark again so as to increase the small ball in diameter and to thereby form a large ball; lowering the capillary tool so as to press the large ball against a pad on a chip and to thereby bond the large ball to the pad; moving the capillary tool onto an electrode on a substrate on which the chip is mounted, so as to press the wire against the electrode and to thereby bond the wire to the electrode; and lifting the capillary tool and cutting off the wire on a bonding point to the electrode.

According to the second aspect of the present invention, there is provided a wire bonding method, wherein the small ball is formed only when a waiting time is long until a wire bonding operation is restarted.

With the first aspect of the invention, the small ball is first formed on the lower end of the wire and then the electric spark is again generated immediately before starting the bonding to the pad on the chip so as to form the large ball, whereby a soft fresh ball can be bonded to the pad on the chip.

With the second aspect of the invention, since the small ball is formed only when the waiting time is long, the electric spark may be normally generated only once, and labor to generate the electric spark twice can be therefore lessened.

BRIEF DESCRIPTION OF THE DRAWINGS

FIGS. 2A–2H show steps of the wire bonding; and

DETAILED DESCRIPTION OF THE PREFERRED EMBODIMENTS

An embodiment of the present invention will be described below with reference to the accompanying drawings.

Figure 3:
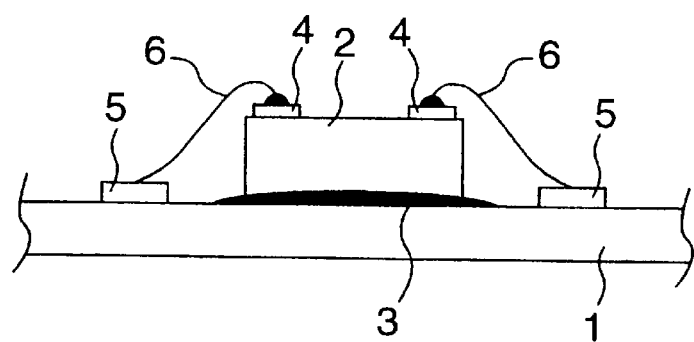
FIG. 3 is a side view of a wire-bonded substrate.

In FIG. 3, a chip 2 is bonded on an upper surface of a substrate 1 by a bond 3. Pads 4 on the chip 2 and electrodes 5 on the substrate 1 are also connected to each other through wires 6. Next, a structure of a wire bonding apparatus for a wire bonding shown in FIG. 3 will be described with reference to FIG. 1.

Figure 1:
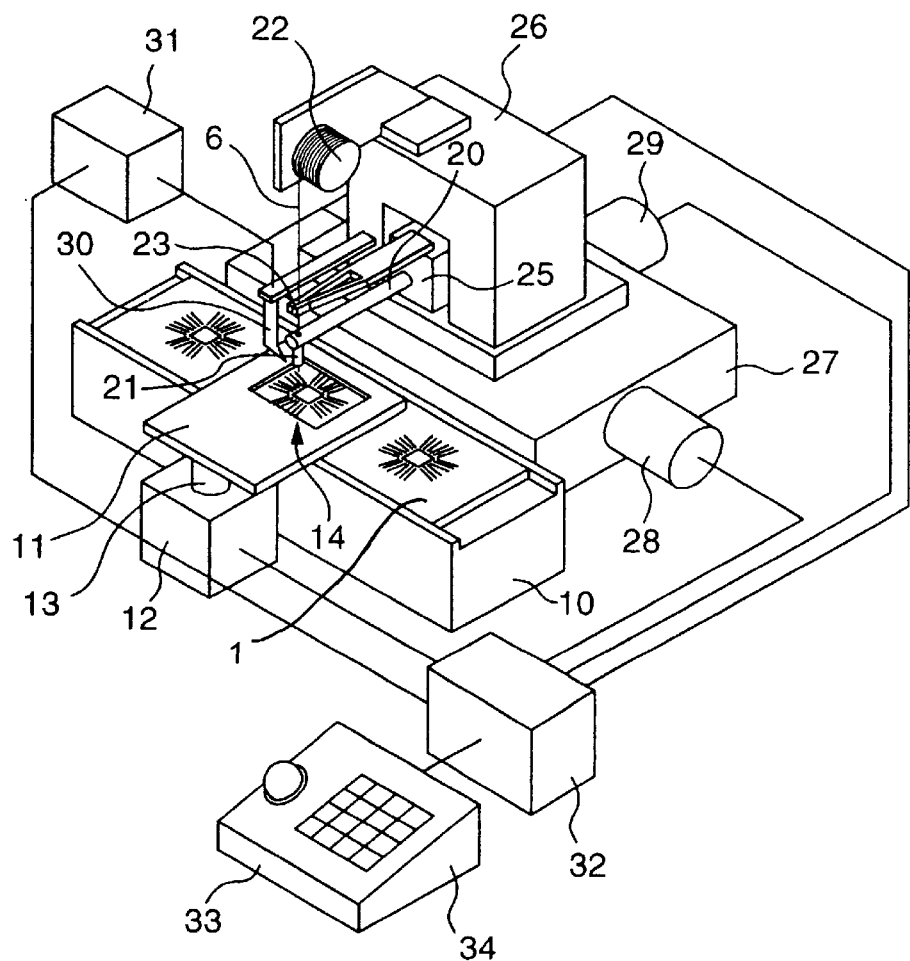
FIG. 1 is a perspective view of a wire bonding apparatus of an embodiment according to the present invention.

In FIG. 1, the substrate 1 is placed on a table 10. Numeral 11 denotes a mask plate arranged on a wire bonding stage and cantilevered by a rod 13 of a cylinder 12. During the wire bonding, the rod 13 is withdrawn downward so as to lower the mask plate 11, whereby a wire bonding area alone on the upper surface of the substrate 1 is exposed through an opening 14.

Numeral 20 denotes a horn holding a capillary tool 21 on the end thereof. The wire 6 drawn out from a spool 22 is inserted through the capillary tool 21. Numeral 23 denotes a clamper for clamping the wire 6 over the capillary tool 21. Numeral 30 denotes a torch for generating an electric spark between it and the lower end of the wire 6 derived from the capillary tool 21 and for forming a ball on the lower end of the wire 6. Numeral 31 denotes a discharge unit for applying a high voltage to the torch 30.

The proximal end of the horn 20 is held by a drive unit 25. The drive unit 25 is driven, whereby the horn 20 is moved upward and downward. A body 26 including the drive unit 25 therein is placed on a movable table 27. An X-axis motor 28 and a Y-axis motor 29 of the movable table 27 are driven, so that the body 26 is horizontally moved in an X-direction and a Y-direction, whereby the capillary tool 21 is also horizontally moved in the same direction. Numeral 32 denotes a controller for controlling the cylinder 12, the X-axis motor 28, the Y-axis motor 29, the discharge unit 31 or the like. Numeral 33 denotes an operation section connected to the controller 32, in which a key 34 is operated so as to thereby enter a necessary input.

This wire bonding apparatus is constituted as described above. The operation of the apparatus will be described below. In the first place, the wire bonding in a first mode will be described with reference to steps shown in FIGS. 2A–2H. FIGS. 2A–2H show a step procedure of the wire bonding operation. First, as shown in FIG. 2A, a small ball 6a is formed on the lower end of the wire 6 derived from the lower end of the capillary tool 21 by the electric spark generated between the lower end of the wire 6 and the torch 30.

Next, as shown in FIG. 2B, the electric spark is again generated between the torch 30 and the small ball 6a, whereby the small ball 6a is increased in diameter so as to form a large ball 6b. A size of this large ball 6b is the same as that of the ball formed by the conventional method. During the above-mentioned operation, the clamper 23 is closed so as to clamp the wire 6. It should be noted that the size of the ball can be adjusted by a level of the voltage applied to the torch 30.

Next, as shown in FIG. 2C, the clamper 23 is opened so as to lower the capillary tool 21, whereby the large ball 6b is pressed against the pad 4 on the chip 2 with the lower surface of the capillary tool 21, so that the ball 6b is bonded to the pad 4. Subsequently, the capillary tool 21 is lifted while it is moved over the electrode 5 on the substrate 1 (FIG. 2D). Then, the capillary tool 21 is again lowered, whereby the wire 6 is pressed against the electrode 5 with the lower surface of the capillary tool 21, so that the wire 6 is bonded to the electrode 5 (FIG. 2E).

Next, the capillary tool 21 is lifted (FIG. 2F). On the way, the wire 6 is again clamped by the clamper 23 so as to lift the wire 6 whereby the wire 6 is cut off on a bonding point to the electrode 5, and then the capillary tool 21 is returned to the original height (FIG. 2G). Next, the torch 30 is brought closer to the lower end of the wire 6 so as to generate the electric spark, whereby the small ball 6a is formed again, and then the operation is returned to a condition shown in FIG. 2A. A series of operations is completed in the above-described manner.

Advantages of the above-described wire bonding method are as follows. Firstly, even when the wire bonding operation is restarted after the wire bonding operation is stopped, a soft fresh ball can be bonded to the pad on the chip. That is, after the wire bonding operation is completed for a single substrate, until this substrate is carried away downstream from the wire bonding stage and the subsequent substrate is carried into the wire bonding stage so that the wire bonding is started for this substrate, the wire bonding operation is temporarily stopped. Meanwhile, the capillary tool 21 is waiting over the stage. Therefore, the small ball 6a is previously formed for this time period, and the electric spark is again generated immediately before the wire bonding operation is restarted so as to increase the small ball 6a to the large ball 6b. Thus, the soft large ball 6b is pressed against the pad 4 on the chip 2 by the lower surface of the capillary tool 21, whereby the large ball 6b can be crushed and be tightly bonded to the pad 4.

Secondly, it is possible to prevent an oxidized film from being formed on the surface of the ball due to a contact of the ball with air during the wait. The oxidized film formed on the surface of the ball inhibits bonding properties of the ball.

Thirdly, it is possible to prevent the lower end of the wire from coming into the capillary tool. That is, in FIG. 2H, the diameter of the small ball 6a is larger than the diameter of a center hole 24 in the capillary tool 21, whereby it is possible to prevent the lower end of the wire 6 from coming into the center hole 24. If the lower end of the wire 6 comes into the center hole 24, this lower end must be again derived from the lower end of the capillary tool 21, and this deriving operation requires enormous labor and time. As described above, according to the above-mentioned wire bonding method, various advantages are obtained.

As described above, although, in this method, the electric spark is generated twice so as to first form the small ball 6a and to subsequently form the large ball 6b, such a ball formation of two steps is not always needed. This formation is carried out only when the above-described waiting time is long. Typically, the ball of a predetermined size may be formed by one electric spark in the same manner as the conventional method. In such a manner, the labor to generate the electric spark twice can be lessened as much as possible.

According to the present invention, the soft fresh ball can be always pressed against the pad on the chip with the lower surface of the capillary tool, and the ball can be sufficiently crushed and bonded to the pad. Also, since it is possible to prevent the oxidized film from being formed on the surface of the ball due to the contact of the ball with the air during the wait, the ball can be excellently bonded to the pad on the chip. Furthermore, the diameter of the small ball is larger than the diameter of the center hole in the capillary tool, whereby it is possible to prevent the lower end of the wire from coming into the center hole.

What is claimed is:

1. A wire bonding method comprising the steps of:

generating an electric spark between a lower end of a wire inserted through a capillary tool and a torch so as to form a small ball on the lower end of said wire;

generating another electric spark so as to increase said small ball in diameter and to thereby form a large ball;

lowering said capillary tool so as to press said large ball against a pad on a chip and to thereby bond said large ball to said pad;

moving said capillary tool onto an electrode on a substrate on which said chip is mounted, so as to press said wire against said electrode and to thereby bond said wire to said electrode; and lifting said capillary tool and cutting off said wire on a bonding point to said electrode.

2. The method according to claim 1, wherein said small ball is formed only when a waiting time is long until a wire bonding operation is restarted.

\* \* \* \* \*